United States Patent

Chen

(10) Patent No.: US 10,672,863 B2
(45) Date of Patent: Jun. 2, 2020

(54) METAL-OXIDE-METAL CAPACITOR STRUCTURE

(71) Applicant: Powerchip Technology Corporation, Hsinchu (TW)

(72) Inventor: Chun-Sheng Chen, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/373,575

(22) Filed: Apr. 2, 2019

(65) Prior Publication Data

US 2020/0135842 A1     Apr. 30, 2020

(30) Foreign Application Priority Data

Oct. 30, 2018  (TW) .............................. 107138383 A

(51) Int. Cl.
*H01G 4/005* (2006.01)
*H01L 49/02* (2006.01)

(52) U.S. Cl.
CPC .................................. *H01L 28/60* (2013.01)

(58) Field of Classification Search
CPC ..................... H01L 28/86; H01L 28/90; H01L 23/5222–5223; H01L 29/92; H01L 29/93; H01L 27/0629; H01L 27/0805; H01G 4/30–33

See application file for complete search history.

(56) References Cited

U.S. PATENT DOCUMENTS

| | | | |
|---|---|---|---|
| 5,208,725 A | 5/1993 | Akcasu | |
| 5,583,359 A | 12/1996 | Ng | |
| 6,743,671 B2 | 6/2004 | Hu | |
| 7,564,675 B2 | 7/2009 | Chen | |
| 7,859,039 B2 | 12/2010 | Yeh | |
| 8,116,063 B2 | 2/2012 | Yeh | |
| 8,537,523 B1 | 9/2013 | Chen | |
| 9,331,013 B2 * | 5/2016 | Yen | ..................... H01L 23/5223 |
| 9,685,433 B2 | 6/2017 | Li | |

(Continued)

FOREIGN PATENT DOCUMENTS

TW      201044553 A1     12/2010
TW      201324556 A1      6/2013

(Continued)

*Primary Examiner* — Shaun M Campbell
*Assistant Examiner* — Suberr L Chi
(74) *Attorney, Agent, or Firm* — Winston Hsu

(57) ABSTRACT

The present invention provides a metal-oxide-metal (MOM) capacitor including a first metal layer and a second metal layer. The first metal layer includes a plurality of first metal stripes and second metal stripes extending along a first direction and a plurality of first metal jogs and second metal jogs extending along a second direction. Each of the first metal jogs is connected to one of the first metal stripes and each of the second metal jogs is connected to one of the second metal stripes. The second metal layer includes a plurality of third metal stripes and fourth metal stripes extending along the first direction and includes a plurality of third metal jogs and fourth metal jogs. Each of the third metal jogs is connected to one of the third metal stripes and each of the fourth metal jogs is connected to one of the fourth metal stripes.

12 Claims, 6 Drawing Sheets

(56) References Cited

U.S. PATENT DOCUMENTS

| | | |
|---|---|---|
| 2004/0174655 A1 | 9/2004 | Tsai |
| 2012/0092806 A1 | 4/2012 | Hua |
| 2013/0200489 A1 | 8/2013 | Huang |
| 2014/0103490 A1 | 4/2014 | Kumar |

FOREIGN PATENT DOCUMENTS

| | | |
|---|---|---|
| TW | 201401475 A | 1/2014 |
| TW | 201507171 A | 2/2015 |
| TW | 201633486 A | 9/2016 |

\* cited by examiner

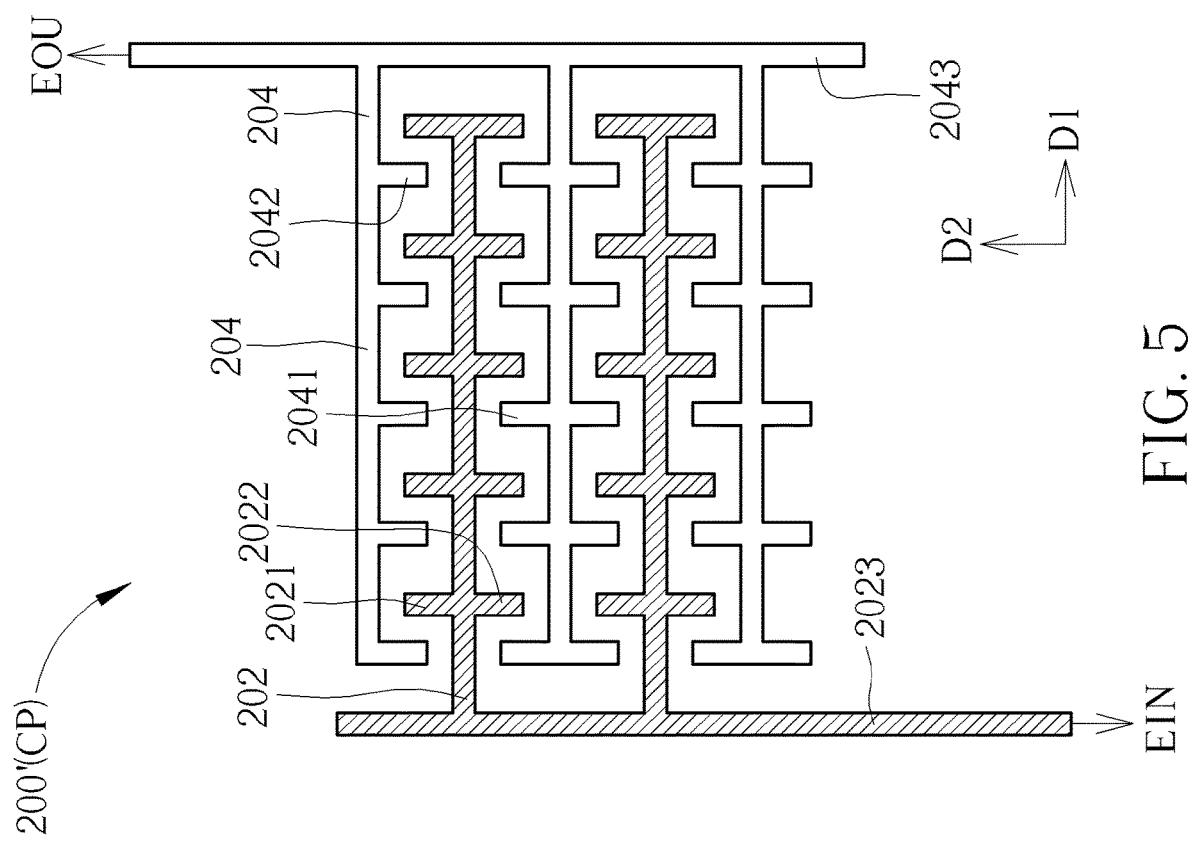
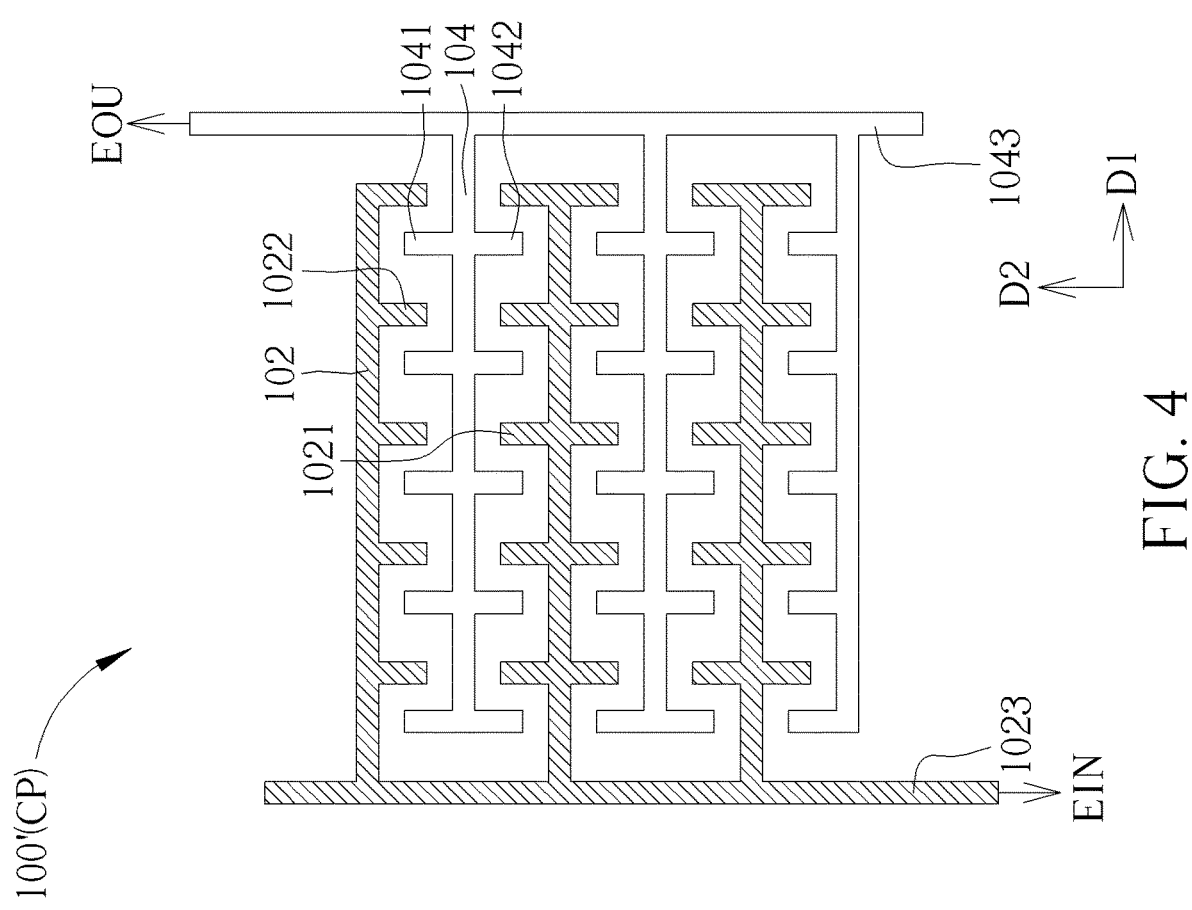

ent invention.

METAL-OXIDE-METAL CAPACITOR STRUCTURE

BACKGROUND OF THE INVENTION

1. Field of the Invention

The present invention relates to a metal-oxide-metal (MOM) capacitor structure, and more particularly to a three-dimensional (3-D) MOM capacitor structure.

2. Description of the Prior Art

MOM capacitor is a conductor-dielectric-conductor capacitor structure which is common in integrated circuits. In the prior art, the upper electrodes and lower electrodes of MOM capacitors are usually formed by metal stripes with flat surfaces, which are arranged alternately in one-dimension or two-dimension. However, in order to increase the density of elements, industries need to keep on researching to produce capacitors with higher density and storage capacity in limited space.

SUMMARY OF THE INVENTION

Accordingly, one of the main purposes of the present invention is to provide a MOM capacitor structure including alternately arranged 3-D structures with opposite polarity in three directions, and having an electrically connecting design with metal jogs and metal plugs to solve the previous problems.

The present invention provides a metal-oxide-metal (MOM) capacitor structure including a first metal layer and a second metal layer. The first metal layer includes: a plurality of first metal stripes and a plurality of second metal stripes extending along a first direction and the first metal stripes and the second metal stripes arranged side by side alternately along a second direction, wherein the first direction intersects the second direction; a plurality of first metal jogs extending along the second direction, wherein each of the first metal jogs connects to one of the first metal stripes; and a plurality of second metal jogs extending along the second direction, wherein each of the second metal jogs connects to one of the second metal stripes. The second metal layer is disposed on the first metal layer and includes: a plurality of third metal stripes and a plurality of fourth metal stripes extending along the first direction and arranged side by side along the second direction; a plurality of third metal jogs extending along the second direction, wherein each of the third metal jogs connects to one of the third metal stripes; and a plurality of fourth metal jogs extending along the second direction, wherein each of the fourth metal jogs connects to one of the fourth metal stripes. On a projection plane, a projection of each of the third metal stripes corresponds to a projection of one of the second metal stripes, a projection of each of the fourth metal stripes corresponds to a projection of one of the first metal stripes, the first metal stripes are electrically connected to the third metal stripes but not electrically connected to the second metal stripes, and the second metal stripes are electrically connected to the fourth metal stripes.

The MOM capacitor structure of the present invention further includes a plurality of first connecting elements and a plurality of second connecting elements. The first connecting elements are disposed between one of the first metal jogs and one of the third metal jogs for electrically connecting the first metal jog and the third metal jog respectively located on the upper side and the lower side of the first connecting element. The second connecting elements are disposed between one of the second metal jogs and one of the fourth metal jogs for electrically connecting the second metal jog and the fourth metal jog respectively located on the upper side and the lower side of the second connecting element. The first connecting elements and the second connecting elements may be metal plugs.

The MOM capacitor structure of the present invention has two kinds of metal stripes with opposite polarities in the same metal layer, and each of the metal stripes is connected to a plurality of metal jogs. The total surface area may be increased by the design of metal jogs and electrically connected metal plugs with respect to the original metal stripe, thereby increasing storage of the capacitor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 schematically illustrates a top view of a first metal layer of a MOM capacitor structure according to a variant embodiment of the first embodiment of the present invention.

FIG. 5 schematically illustrates a top view of a second metal layer of the MOM capacitor structure according to the variant embodiment of the first embodiment of the present invention.

DETAILED DESCRIPTION

For one skilled in the art can further understanding the present invention, some better embodiments taken in conjunction with the drawings are described below to clarify the structure of MOM capacitor of the present invention.

Figure 2:
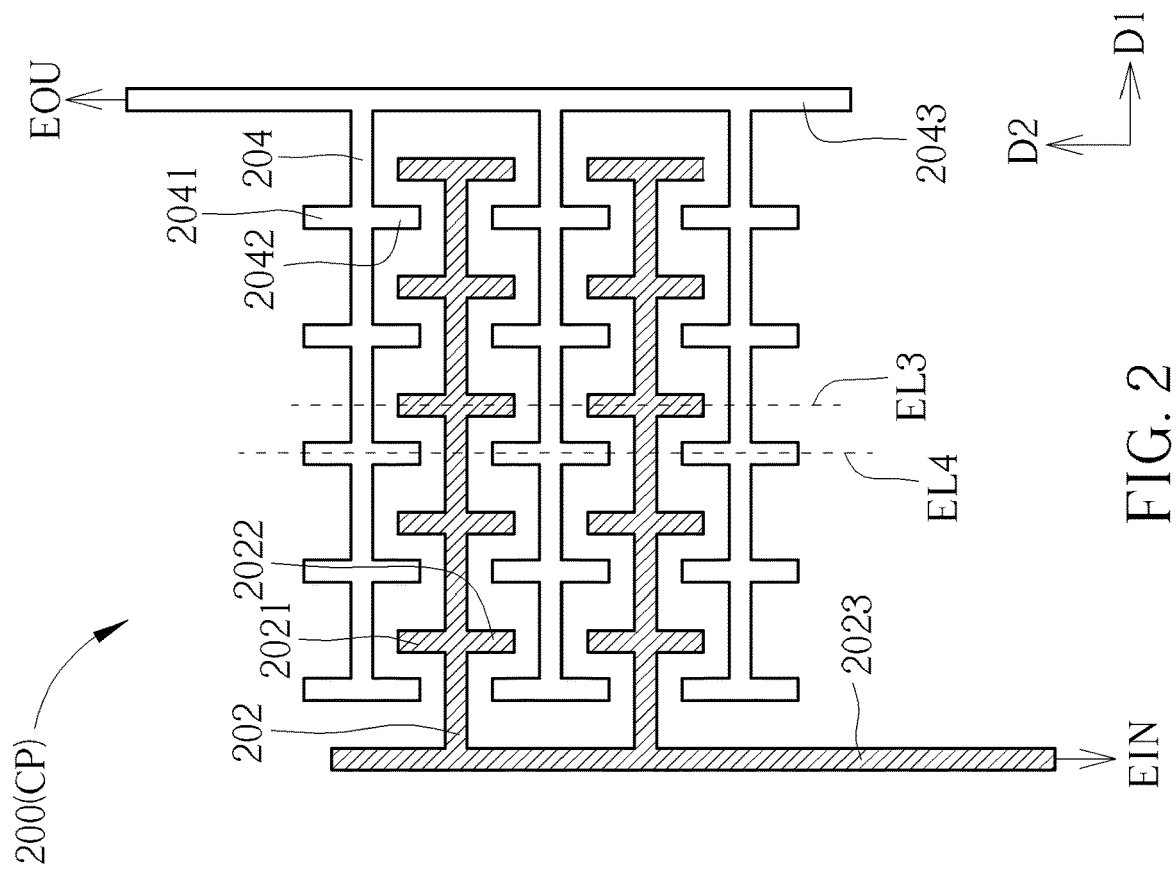
FIG. 2 schematically illustrates a top view of a second metal layer of the MOM capacitor structure according to the first embodiment of the present invention.
Figure 1:
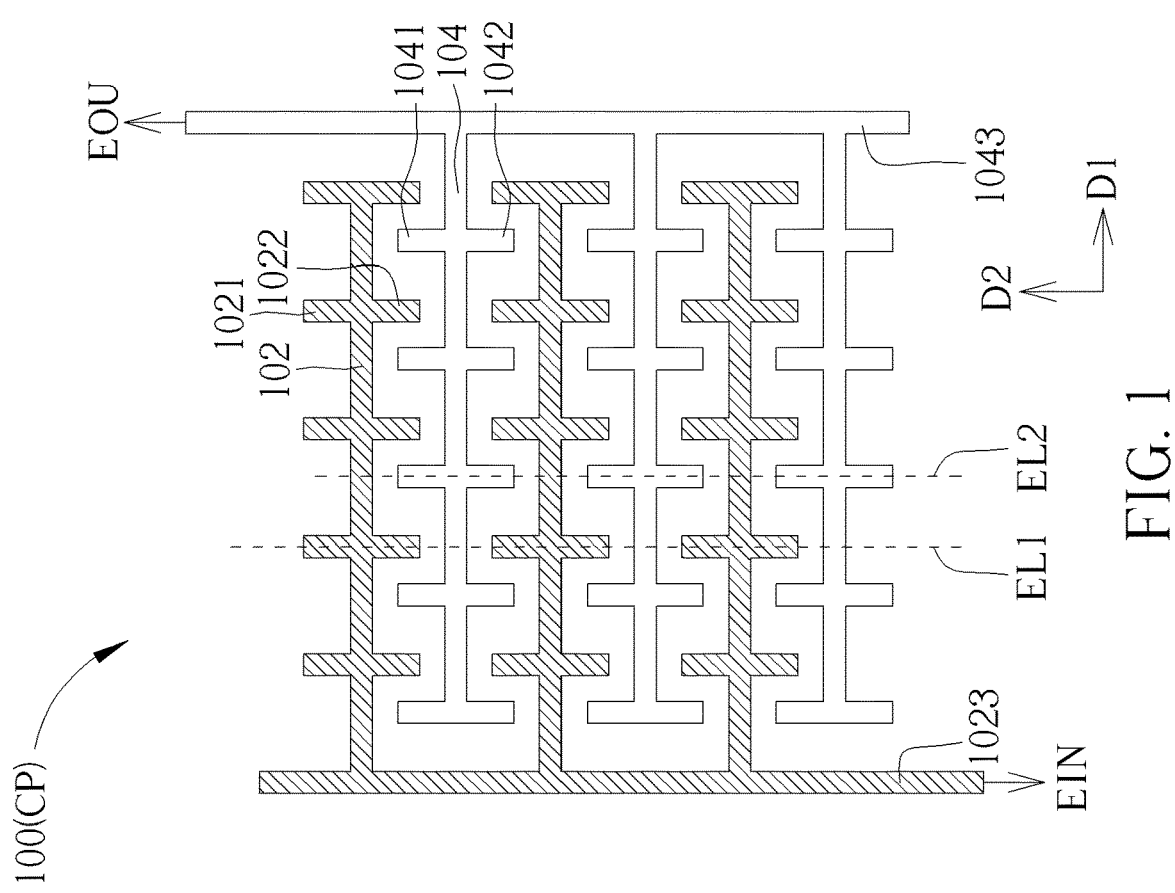
FIG. 1 schematically illustrates a top view of a first metal layer of a MOM capacitor structure according to a first embodiment of the present invention.
Figure 3:
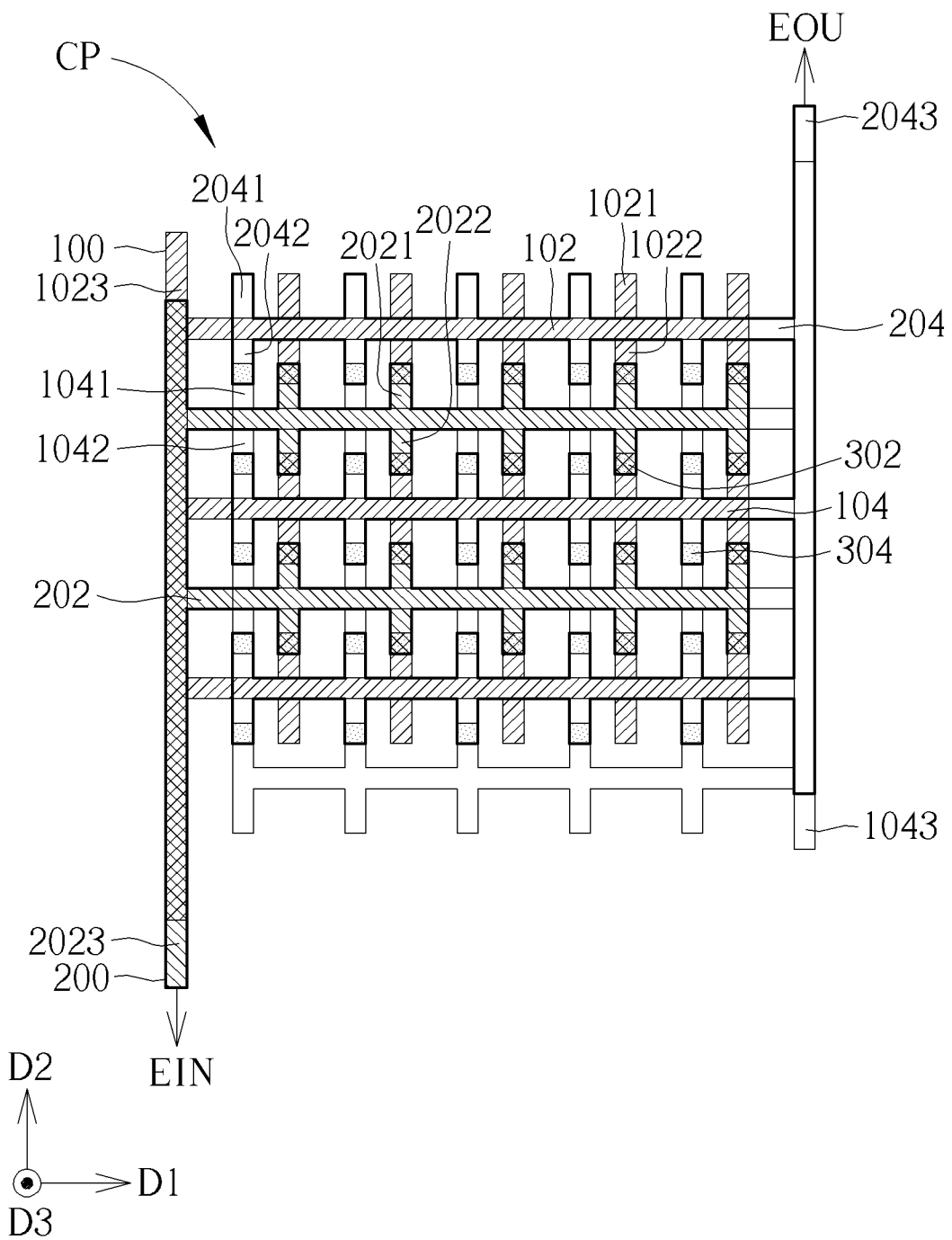
FIG. 3 schematically illustrates a top view of a stacked first metal layer and second metal layer of the MOM capacitor structure according to the first embodiment of the present invention.

Referring to FIG. 1 to FIG. 3, FIG. 1 schematically illustrates a top view of a first metal layer of a MOM capacitor structure according to a first embodiment of the present invention, FIG. 2 schematically illustrates a top view of a second metal layer of the MOM capacitor structure according to the first embodiment of the present invention, and FIG. 3 schematically illustrates a top view of a stacked first metal layer and second metal layer of the MOM capacitor structure according to the first embodiment of the present invention. The MOM capacitor structure CP of the present invention is a three-dimension (3-D) capacitor structure which includes more than two metal layers, for example, three layers, four layers or more. To simplify the description, two metal layers are used as example for the following description in this embodiment. First, referring to FIG. 1, the MOM capacitor structure CP of the present invention includes a first metal layer 100. The material of the first metal layer 100 may be any suitable metal material for capacitor structures, such as copper (Cu), aluminum (Al), silver (Ag), and tungsten (W), but no limited thereto. The first metal layer 100 includes a plurality of first metal stripes 102, a plurality of second metal stripes 104, a plurality of first metal jogs 1021 and 1022, and a plurality of second metal jogs 1041 and 1042. The first metal stripes 102 and the second metal stripes 104 extend along a first direction D1, and the first metal stripes 102 and the second metal stripes 104 are arranged side by side alternately along a second direction D2, wherein the first direction D1 intersects the second direction D2. The first direction D1 is perpendicular to the second direction D2 in this embodiment as an example, but not limited thereto. Furthermore, the first metal stripe 102 and the second metal stripe 104 are not electrically connected to each other.

The first metal jogs 1021 and 1022 extend along the second direction D2, each of the first metal jogs 1021 and 1022 is connected to one of the first metal stripes 102, thereby electrically connecting the first metal stripes 102. As shown in FIG. 1, the first metal jogs 1021 and the first metal jogs 1022 are respectively located on two sides of the first metal stripes 102, and any one of the first metal jogs 1021 corresponds to one of the first metal jogs 1022, so that the first metal jog 1021, the corresponding first metal jog 1022 and the first metal stripe 102 connected to the first metal jog 1021 show a cross pattern "+" in the intersection. In other words, the first metal jog 1021 located on one side of the first metal stripe 102 and the first metal jog 1022 located on another side of the first metal stripe 102 are mirror-symmetric by regarding the first metal stripe 102 as a symmetry line. Similarly, the second metal jogs 1041 and 1042 extend along the second direction D2, each of the second metal jogs 1041 and 1042 is connected to one of the second metal stripes 104, thereby electrically connecting the second metal stripes. The second metal jogs 1041 and the second metal jogs 1042 are respectively located on two sides of the second metal stripes 104, and any one of the second metal jogs 1041 corresponds to one of the second metal jogs 1042, so that the second metal jog 1041, the corresponding second metal jog 1042 and the second metal stripe 104 connected to the second metal jog 1041 show a cross pattern "+" in the intersection. In other words, the second metal jog 1041 located on one side of the second metal stripe 104 and the second metal jog 1042 located on another side of the second metal stripe 104 are mirror-symmetric by regarding the second metal stripe 104 as a symmetry line.

In another aspect, a plurality of first metal jogs 1021 or 1022 and a plurality of second metal jogs 1041 or 1042 are disposed between a first metal stripe 102 and an adjacent second metal stripe 104, the first metal jogs 1021 or 1022 and the second metal jogs 1041 or 1042 are arranged side by side alternately along the first direction D1. The first metal jogs 1021 and 1022 connected to different first metal stripes 102 are aligned along the second direction D2, that is, an extending line (for example the extending line EL1) of one of the first metal jogs 1021 or 1022 along the second direction D2 overlaps the first metal jog 1021 or 1022 connected to another first metal stripe 102. The second metal jogs 1041 and 1042 connected to different second metal stripes 104 also have similar aligned relationship, which will not be redundantly described. Besides, in this embodiment, an extending line (for example the extending line EL1) of any one of the first metal jogs 1021 or 1022 along the second direction D2 and an extending line (for example the extending line EL2) of any one of the second metal jogs 1041 or 1042 along the second direction D2 are misaligned. That is, the first metal jogs 1021 and 1022 do not overlap the second metal jogs 1041 and 1042 in the second direction D2.

In this embodiment, the first metal layer 100 further includes a first bus line 1023 extending along the second direction D2 and electrically connected to more than one of the first metal stripes 102. As shown in FIG. 1, all of the first metal stripes 102 extend to left along the first direction D1 to connect to the first bus line 1023, thereby electrically connecting to the first bus line 1023. In other words, the first metal stripes 102 and the first metal jogs 1021 and 1022 are electrically connected to each other through the first bus line 1023, so as to form a first electrode of the MOM capacitor structure CP, such as an upper electrode of the capacitor. For example, the lower side of the first bus line 1023 may be electrically connected to an input port EIN to input voltage or electric charge to the first bus line 1023, the first metal stripes 102 and the first metal jogs 1021 and 1022 connected to the first metal stripes 102. In a variant embodiment, the lower side of the first bus line 1023 may be electrically connected to an output port. Similarly, the first metal layer 100 further includes a second bus line 1043 extending along the second direction D2 and electrically connected to more than one of the second metal stripes 104. As shown in FIG. 1, all of the second metal stripes 104 extend to right along the first direction D1 to connect to the second bus line 1043, thereby electrically connecting to the second bus line 1043. In other words, the second metal stripes 104 and the second metal jogs 1041 and 1042 are electrically connected to each other through the second bus line 1043, so as to form a second electrode of the MOM capacitor structure CP, such as a lower electrode of the capacitor. For example, the upper side of the second bus line 1043 may be electrically connected to an output port EOU to output the stored voltage or electric charge in the second metal stripes 104 and the second metal jogs 1041 and 1042 connected to the second metal stripes 104 by the second bus line 1043. In a variant embodiment, the upper side of the second bus line 1043 may be electrically connected to an input port. It can be seen from FIG. 1 that the first metal stripes 102, the first metal jogs 1021 and 1022, the second metal stripes 104, and the second metal jogs 1041 and 1042 are all located between the first bus line 1023 and the second bus line 1043. Furthermore, the electrical polarity of the first metal stripes 102 and the first metal jogs 1021 and 1022 is opposite to the electrical polarity of the second metal stripes 104 and the second metal jogs 1041 and 1042 in this embodiment.

Referring to FIG. 2, FIG. 2 schematically illustrates a top view of a second metal layer of the MOM capacitor structure according to the first embodiment of the present invention. The MOM capacitor structure CP includes a second metal layer 200, wherein the material of the second metal layer 200 can refers to the above-mentioned materials of the first metal layer 100, which will not be redundantly described. The second metal layer 200 includes a plurality of third metal stripes 202 and a plurality of fourth metal stripes 204 extending along the first direction D1, and the third metal stripes 202 and the fourth metal stripes 204 are arranged side by side alternately along the second direction D2. The second metal layer 200 further includes a plurality of third metal jogs 2021 and 2022 extending along the second direction D2, wherein each of the third metal jogs 2021 and 2022 is connected to one of the third metal stripes 202. Furthermore, the second metal layer 200 further includes a plurality of fourth metal jogs 2041 and 2042 extending along the second direction D2, and each of the fourth metal jogs 2041 and 2042 is connected to one of the fourth metal stripes 204. In the second metal layer 200, the relative arrangement of the third metal jogs 2021 and 2022 and the third metal stripes 202 and the relative arrangement of the fourth metal jogs 2041 and 2042 and the fourth metal stripes 204 are similar to the first metal layer 100. For example, the third metal jogs 2021 and the third metal jogs 2022 are respectively located on two sides of the connected third metal stripes 202, and any one of the third metal jogs 2021 corresponds to one of the third metal jogs 2022, so that the third metal jog 2021 and the corresponding third metal jog 2022 and the third metal stripe 202 connected to the third metal jog 2021 show a cross pattern "+" in the intersection. In other words, the third metal jog 2021 located on one side of the third metal stripe 202 and the third metal jog 2022 located on another side of the third metal stripe 202 are mirror-symmetric by regarding the third metal stripe 202 as a symmetry line. Similarly, the fourth metal jogs 2041 and 2042 are connected to one of the fourth metal stripes 204 and are electrically connected with each other. The fourth metal jogs 2041 and the fourth metal jogs 2042 are respectively located on two sides of the fourth metal stripes 204, and anyone of the fourth metal jogs 2041 corresponds to one of the fourth metal jogs 2042, so that the fourth metal jog 2041 and the corresponding fourth metal jog 2042 and the fourth metal stripe 204 connected to the fourth metal jog 2041 show a cross pattern "+" in the intersection. In other words, the fourth metal jog 2041 located on one side of the fourth metal stripe 204 and the fourth metal jog 2042 located on another side of the fourth metal stripe 204 are mirror-symmetric by regarding the fourth metal stripe 204 as a symmetry line.

In another aspect, a plurality of third metal jogs 2021 or 2022 and a plurality of fourth metal jogs 2041 or 2042 are disposed between a third metal stripe 202 and an adjacent fourth metal stripe 204, and the third metal jogs 2021 or 2022 and the fourth metal jogs 2041 or 2042 are arranged side by side alternately along the first direction D1. The third metal jogs 2021 and 2022 connected to different third metal stripes 202 are aligned along the second direction D2, that is, an extending line (for example the extending line EL3) of one of the third metal jogs 2021 or 2022 along the second direction D2 overlaps the another third metal jog 2021 or 2022 connected to another third metal stripes 202. The fourth metal jogs 2041 and 2042 connected to different fourth metal stripes 204 also have similar aligned relationship, which will not be redundantly described. Besides, in this embodiment, an extending line (for example the extending line EL3) of any one of the third metal jogs 2021 or 2022 along the second direction D2 and an extending line (for example the extending line EL4) of any one of the fourth metal jogs 2041 or 2042 along the second direction D2 are misaligned. That is, the third metal jogs 2021 and 2022 do not overlap the fourth metal jogs 2041 and 2042 in the second direction D2.

Similar to the first metal layer 100, the second metal layer 200 of this embodiment further includes a third bus line 2023 and a fourth bus line 2043 extending along the second direction D2, wherein the third bus line is connected to more than one of the third metal stripes 202, and the fourth bus line is connected to more than one of the fourth metal stripes 204. For example, the lower side of the third bus line 2023 can be electrically connected to an input port EIN to input signal or current, the upper side of the fourth bus line 2043 can be electrically connected to an output port EOU to output signal or current. In a variant embodiment, the lower side of the third bus line 2023 can be electrically connected to an output port and the upper side of the fourth bus line 2043 can be electrically connected to an input port. The third metal stripes 202 and the third metal jogs 2021 and 2022 can be electrically connected to each other through the third bus line 2023, so as to form a first electrode of the MOM capacitor structure CP. The fourth metal stripes 204 and the fourth metal jogs 2041 and 2042 can be electrically connected to each other through the fourth bus line 2043, so as to form a second electrode of the MOM capacitor structure CP. The electrical polarity of the first electrode may be opposite to the electrical polarity of the second electrode.

Referring to FIG. 3, in the stacking structure of the MOM capacitor structure according to the first embodiment of the present invention, the second metal layer 200 and the first metal layer 100 are stacked along a third direction D3. For example, the second metal layer 200 is located on the upper side of first metal layer 100, but not limited thereto. In a variant embodiment, the second metal layer 200 may be located on the lower side of the first metal layer 100. The MOM capacitor structure CP of the present invention may include multiple metal layers, for example, including more than one first metal layer 100 and more than one second metal layer 200 alternately stacked with each other along the third direction D3, that is, when the first metal layer 100 is the nth layer, the second metal layer 200 may be the n−1th layer or the n+1th layer. According to the present invention, when the second metal layer 200 is stacked on the first metal layer 100, a projection of each of the third metal stripes 202 overlaps and corresponds to a projection of one of the second metal stripes 104, and a projection of each of the fourth metal stripes 204 overlaps and corresponds to a projection of one of the first metal stripes 102. That is, one of the third metal stripes 202 and one of the second metal stripes 104 are overlapped and correspond to each other, and one of the fourth metal stripes 204 and one of the first metal stripes 102 are overlapped and correspond to each other. Furthermore, the first metal stripes 102 of the first metal layer 100 are electrically connected to the third metal stripes 202 of the second metal layer 200, and the second metal stripes 104 of the first metal layer 100 are electrically connected to the fourth metal stripes 204 of the second metal layer 200 in this embodiment, such that the first metal stripes 102 and the third metal stripes 202 may form a first electrode of the MOM capacitor structure CP and the second metal stripes 104 and the fourth metal stripes 204 may form a second electrode, which can form the MOM capacitor structure with stereo structure. In detail, a first metal jog 1022 connected to the first metal stripe 102 may partially overlap a third metal jog 2021 connected to the third metal stripe 202 in the third direction D3, and a connection element 302, such as a metal plug, is disposed between the first metal jog 1022 and the third metal jog 2021 for electrically connecting the corresponding first metal jog 1022 and third metal jog 2021 respectively located on two sides of the connection element 302. That is, the connection element 302, the first metal jog 1022 and the third metal jog 2021 are partially overlapped with each other and are electrically connected. Similarly, a first metal jog 1021 connected to the first metal stripe 102 may also partially overlap a third metal jog 2022 connected to the third metal stripe 202 in the third direction D3, and a connection element 302 is disposed between the first metal jog 1021 and the third metal jog 2022. On the other hand, a second metal jog 1042 connected to the second metal stripe 104 may partially overlap a fourth metal jog 2041 connected to the fourth metal stripe 204 in the third direction D3, and the second metal jog 1042 and the fourth metal jog 2041 are electrically connected to each other through a connection element 304 (for example a metal plug) disposed therebetween. Similarly, a second metal jog 1041 connected to the second metal stripe 104 may partially overlap a fourth metal jog 2042 connected to the fourth metal stripe 204 in the third direction D3, and the second metal jog 1041 and the fourth metal jog 2042 are electrically connected to each other through a connection element 304 disposed therebetween. Under this design, more than one of the second metal stripes 104 of the first metal layer 100 can be electrically connected to more than one of the fourth metal stripes 204 of the second metal layer 200 by the connection elements 304, more than one of the first metal stripes 102 of the first metal layer 100 can be electrically connected to more than one of the third metal stripes 202 of the second metal layer 200 by the connection elements 302, so as to form the second electrode and the first electrode of the MOM capacitor structure CP respectively. Besides, on a projection plane, a projection of the first bus line 1023 at least partially overlaps a projection of the third bus line 2023, and a projection of the second bus line 1043 at least partially overlaps a projection of the fourth bus line 2043.

According to the present invention, in the first metal layer 100, because the first metal jogs 1021 and 1022 are connected to two sides of the first metal stripes 102 respectively, the surface from the first metal stripe 102 to the first metal jogs 1021 and 1022 is jagged and non-planar. Similarly, the second metal jogs 1041 and 1042 are connected to two sides of the second metal stripes 104 respectively, so the surface from the second metal stripe 104 to the second metal jogs 1041 and 1042 is also jagged and non-planar. This design make the surfaces of the first metal stripes 102, and the first metal jogs 1041 and 1042 that face the second metal stripes 104 and the surfaces of the second metal stripes 104 and the second metal jogs 1041 and 1042 that face the first metal stripes 102 become larger, that is, the surface areas of the faced portions between these elements are increased. Furthermore, by the design of making the first metal jogs 1021 and 1022 and the second metal jogs 1041 and 1042 misaligned and alternately arranged, surface areas of the faced portion between them may further be increased. Comparing to the capacitor structure of the prior art which has only straight metal stripes and has no metal jogs, the design with the first metal jogs 1021 and 1022 and the second metal jogs 1041 and 1042 of the present invention may largely increase the surface areas of the faced portions between the first electrode and the second electrode, so that the storage capacity per unit volume or per unit area may also be increased. The design of the second metal layer 200 of the present invention is similar. The third metal jogs 2021 and 2022 on two sides of the third metal stripes 202 and the fourth metal jogs 2041 and 2042 on two sides of the fourth metal stripes 204 may also increase the surface areas of the faced portions between the first electrode and the second electrode, and therefore the storage capacity per unit volume or per unit area may be increased.

Refer to FIG. 4 and FIG. 5. FIG. 4 and FIG. 5 schematically illustrate a MOM capacitor structure according to a variant embodiment of first embodiment of the present invention, wherein FIG. 4 schematically illustrates a top view of a first metal layer of the MOM capacitor structure, and FIG. 5 schematically illustrates a top view of a second metal layer of the MOM capacitor structure. The main difference between this variant embodiment and the first embodiment is that the first metal jogs 1021, the second metal jogs 1042 and the third metal jogs 2021 disposed on the outermost are omitted. As shown in FIG. 4, there is no first metal jog 1021 disposed on the upper side of the first metal stripe 102 in the uppermost side in the figure. The first metal stripe 102 in the uppermost side in the figure only has first metal jogs 1022 located on the lower side of the first metal stripe 102; there is no second metal jog 1042 disposed on the lower side of the second metal stripe 104 in the lowermost side in the figure. The second metal stripe 104 in the lowermost side in the figure only has second metal jogs 1042 located on the upper side of the second metal stripe 104. Because there is no other electrode of the capacitor structure located outside the first metal stripe 102 in the uppermost side and the second metal stripe 104 in the lowermost side, the first metal jogs 1022 and the second metal jogs 1042 are not needed to increase the surface area of the electrode. Under this design, the outside of the uppermost first metal stripe 102 and the outside of the lowermost second metal stripe 104 are all planar stripe surfaces. On the other hand, as shown in FIG. 5, there is no fourth metal jog 2041 disposed on the upper side of the fourth metal stripe 204 in the uppermost side, thus the outside of the uppermost fourth metal stripe 204 is a planar stripe surface.

Figure 6:
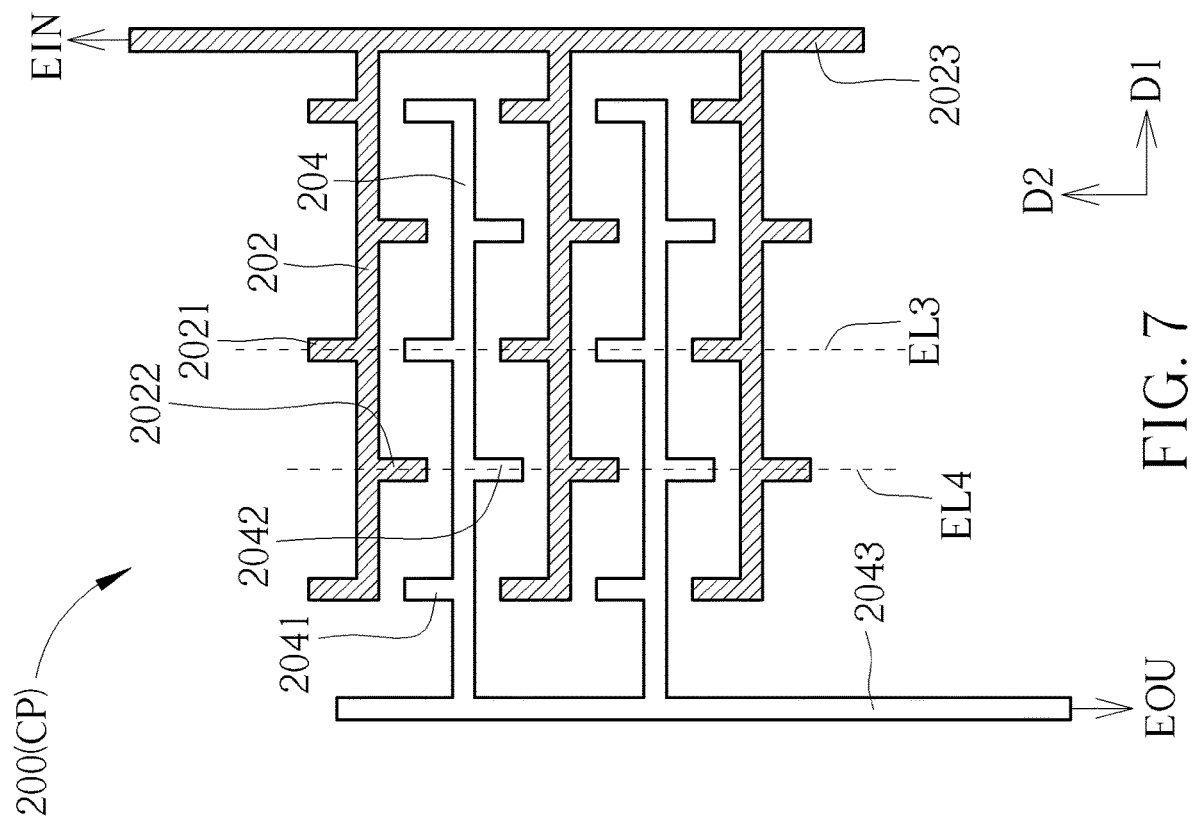
FIG. 6 schematically illustrates a top view of a first metal layer of a MOM capacitor structure according to a second embodiment of the present invention.
Figure 7:
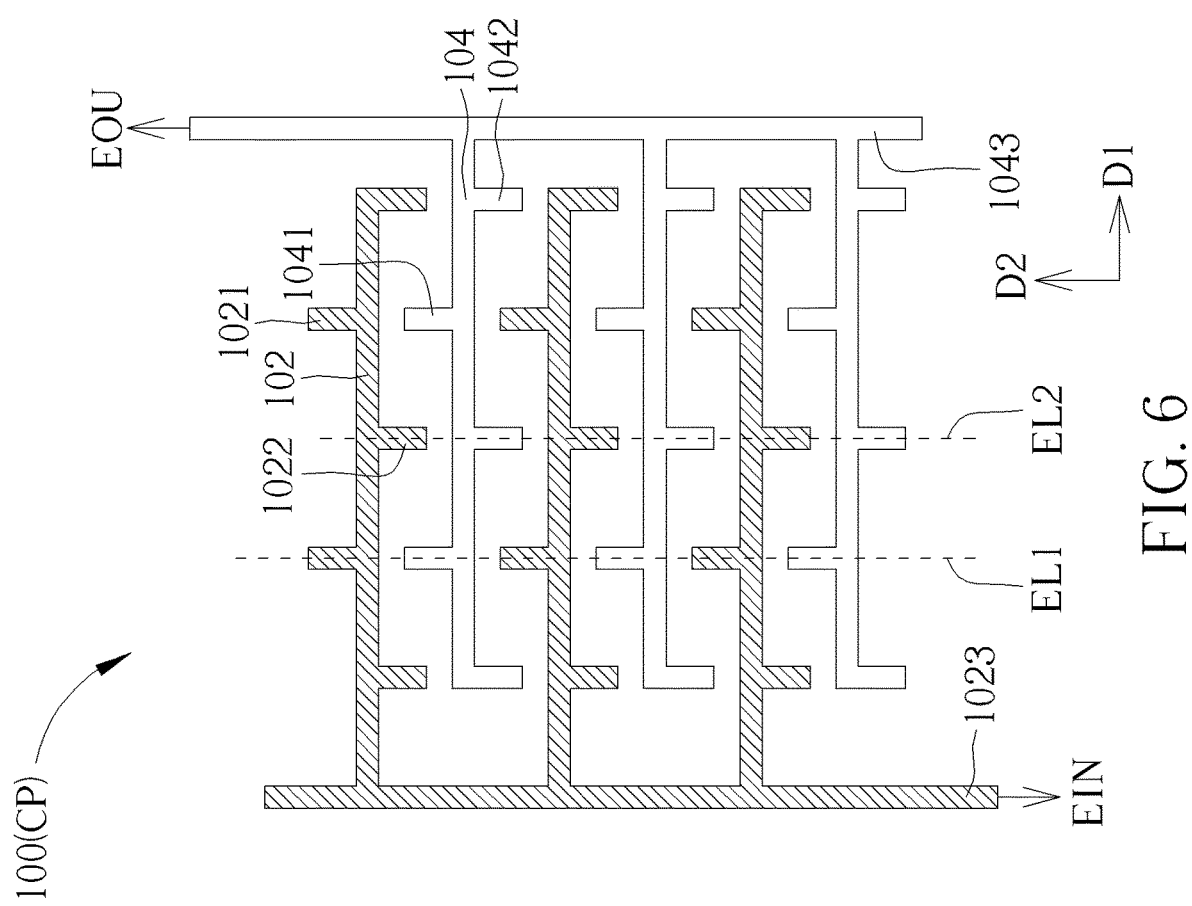
FIG. 7 schematically illustrates a top view of a second metal layer of the MOM capacitor structure according to the second embodiment of the present invention.
Figure 8:
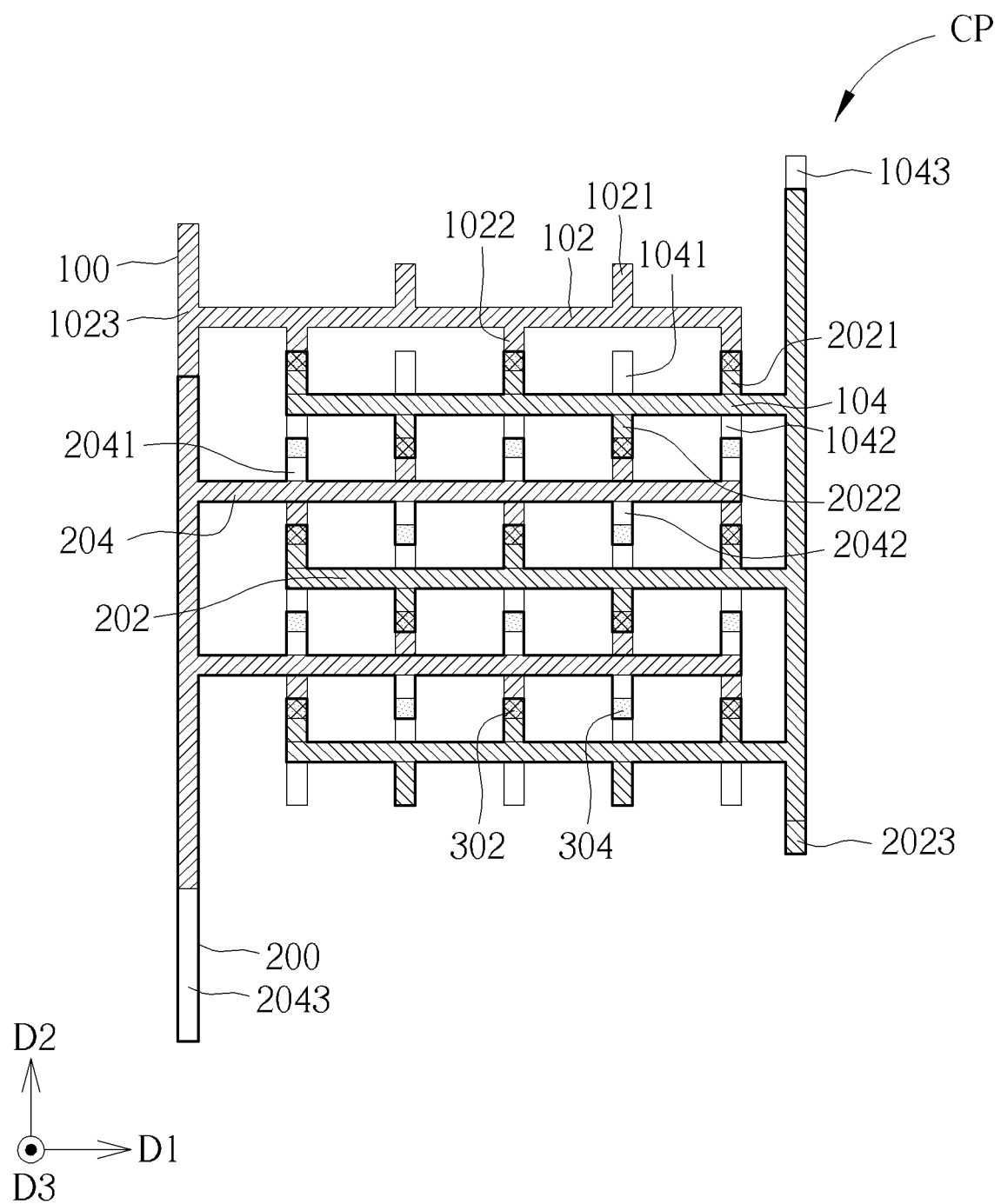
FIG. 8 schematically illustrates a top view of a stacked first metal layer and second metal layer of the MOM capacitor structure according to the second embodiment of the present invention.

Refer to FIG. 6 to FIG. 8. FIG. 6 schematically illustrates a top view of a first metal layer of a MOM capacitor structure according to a second embodiment of the present invention, FIG. 7 schematically illustrates a top view of a second metal layer of the MOM capacitor structure according to the second embodiment of the present invention, and FIG. 8 schematically illustrates a top view of a stacked first metal layer and second metal layer of the MOM capacitor structure according to the second embodiment of the present invention. The main difference between this embodiment and the first embodiment is the arrangement of the metal jogs. First, referring to FIG. 6, in the first metal layer 100 of this embodiment, the first metal jogs 1021 and 1022 connected to the same first metal stripe 102 are misaligned and not overlapped along the second direction D2, that is, the extending lines (for example the extending line EL1) of any two of the first metal jogs 1021 and 1022 along the second direction D2 are misaligned. In other words, the first metal jogs 1021 and 1022 respectively disposed on two sides of the first metal stripes 102 regard the first metal stripe 102 as an anti-symmetric line. Similarly, the second metal jogs 1041 and 1042 connected to the same second metal stripe 104 are misaligned and not overlapped along the second direction D2, that is, the extending lines (for example the extending line EL2) of any two of the second metal jogs 1041 and 1042 along the second direction D2 are misaligned. In other words, the second metal jogs 1041 and 1042 respectively disposed on two sides of the second metal stripes 104 regard the second metal stripe 104 as an anti-symmetric line. Furthermore, in this embodiment, the first metal jogs 1021 located on the upper side of the first metal stripes 102 are aligned with the second metal jogs 1041 located on the upper side of the second metal stripes 104 in the second direction D2, and the extending lines (for example the extending line EL1) of the first metal jogs 1021 along the second direction D2 overlap at least one of the second metal jogs 1041 respectively. Similarly, the first metal jogs 1022 located on the lower side of the first metal stripes 102 are aligned with the second metal jogs 1042 located on the lower side of the second metal stripes 104 in the second direction D2, and the extending lines (for example the extending line EL2) of the second metal jogs 1042 along the second direction D2 overlap at least one of the first metal jogs 1022 respectively.

Referring to FIG. 7, the design of the relative position of the third metal jogs 2021, 2022 and the fourth metal jogs 2041, 2042 in the second metal layer 200 in FIG. 7 is similar to the first metal layer 100. The third metal jogs 2021 and 2022 are misaligned in the second direction D2, the fourth metal jogs 2041 and 2042 are misaligned in the second direction D2, and the third metal jogs 2021 and the fourth metal jogs 2041 are aligned and overlapped in the second direction D2. The extending lines (for example the extending line EL3) of the third metal jogs 2021 along the second direction D2 overlap more than one of the fourth metal jogs 2041. The third metal jogs 2022 and the fourth metal jogs 2042 are aligned and overlapped in the second direction D2. The extending lines (for example the extending line EL4) of the fourth metal jogs 2042 along the second direction D2 overlap more than one of the third metal jogs 2022.

Referring to FIG. 8, the MOM capacitor structure CP according to the second embodiment of the present invention includes a first metal layer 100 and a second metal layer 200 stacked along the third direction D3. In some embodiments, the MOM capacitor structure CP may include more than two first metal layers 100 and more than two second metal layers 200 stacked alternately. One first metal layer 100 and one second metal layer 200 drawn in FIG. 8 are only for illustration. The same as the first embodiment, on a projection plane perpendicular to the third direction D3, the first metal stripes 102 and the third metal stripes 202 are misaligned, and the second metal stripes 104 and the fourth metal stripes 204 are misaligned. A projection of one of the first metal stripes 102 may correspond to and overlap a projection of one of the fourth metal stripes 204, and a projection of one of the second metal stripes 104 may correspond to and overlap a projection of one of the third metal stripes 202. Furthermore, the first metal jogs 1022 may partially overlap the third metal jogs 2021, and these two metal jogs are electrically connected to each other by connection elements 302. The first metal jogs 1021 may partially overlap the third metal jogs 2022, and these two metal jogs are electrically connected to each other by the connection elements 302. Accordingly, the first metal stripes 102 can be electrically connected to the third metal stripes 202 through the first metal jogs 1021 and 1022, the connection elements 302 and the third metal jogs 2021 and 2022, so as to form the first electrode of the MOM capacitor structure CP. Similarly, the second metal jogs 1042 may partially overlap the fourth metal jogs 2041, and these two metal jogs are electrically connected to each other by connection elements 304. The second metal jogs 1041 may partially overlap the fourth metal jogs 2042, and these two metal jogs are electrically connected to each other by the connection elements 304. Therefore, the second metal stripes 104 can be electrically connected to the fourth metal stripes 204 through the second metal jogs 1041, 1042, the connection element 304 and the fourth metal jogs 2041, 2042, so as to form the second electrode of the MOM capacitor structure CP. Besides, it should be noted that in the first metal layer 100 in this embodiment, the first metal stripes 102 and the first metal jogs 1021 and 1022 as the first electrode can be electrically connected to an input port EIN on lower side by the first bus line 1023, the second metal stripes 104 and the second metal jogs 1041 and 1042 as the second electrode can be electrically connected to an output port EOU on upper side by the second bus line 1043. However, the positions of the input port EIN and the output port EOU in the second metal layer 200 are opposite to the positions in the first metal layer 100, that is, the third metal stripes 202 and the third metal jogs 2021 and 2022 as the first electrode can be electrically connected to an input port EIN on upper side by the third bus line 2023, and the fourth metal stripes 204 and the fourth metal jogs 2041 and 2042 as the second electrode can be electrically connected to an output port EOU on lower side by the fourth bus line 2043. According to this embodiment, on a projection plane perpendicular to the third direction D3, at least a projection of the first bus line 1023 and a projection of the fourth bus line 2043 are partially overlapped, and at least a projection of the second bus line 1043 and a projection of the third bus line 2023 are partially overlapped.

Figure 10:
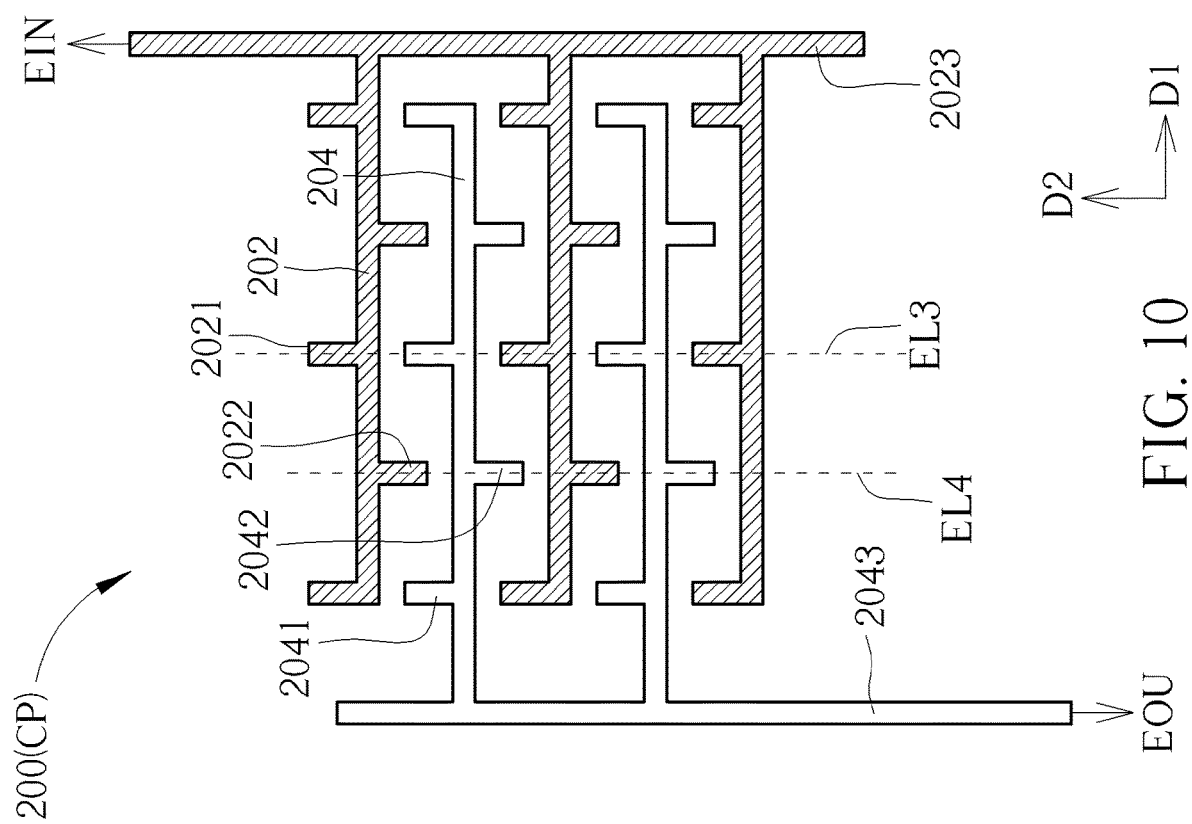
FIG. 10 schematically illustrates a top view of a second metal layer of the MOM capacitor structure according to the variant embodiment of the second embodiment of the present invention.
Figure 9:
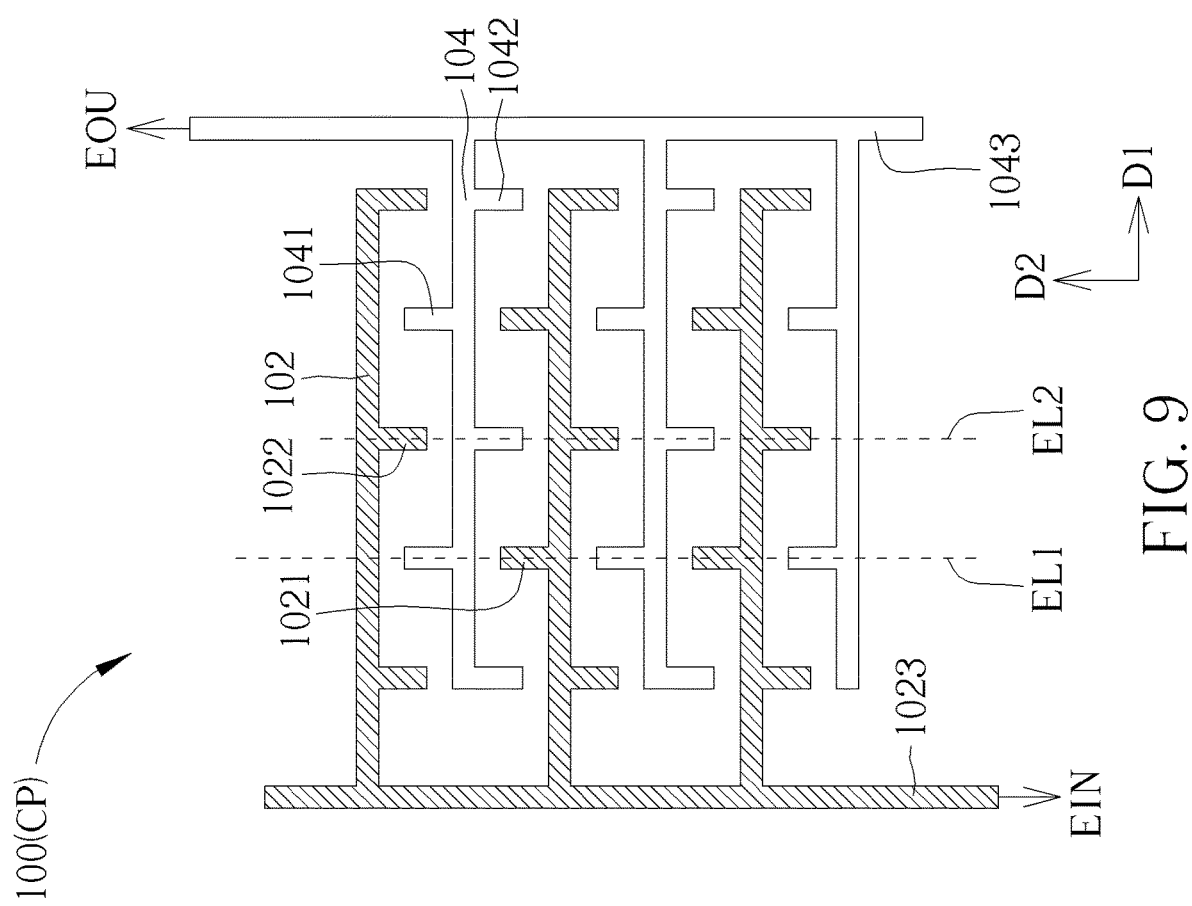
FIG. 9 schematically illustrates a top view of a first metal layer of a MOM capacitor structure according to a variant embodiment of the second embodiment of the present invention.

Referring to FIG. 9 to FIG. 10, FIG. 9 and FIG. 10 schematically illustrate a MOM capacitor structure according to a variant embodiment of the second embodiment of the present invention, wherein FIG. 9 schematically illustrates a top view of a first metal layer of the MOM capacitor structure, and FIG. 10 schematically illustrates a top view of a second metal layer of the MOM capacitor structure. The main difference between this variant embodiment and the second embodiment is that the first metal jogs 1021, the second metal jogs 1042 and the third metal jogs 2022 disposed on the outermost are omitted. As shown in FIG. 9, there is no first metal jog 1021 disposed on the upper side of the uppermost first metal stripe 102 in the uppermost side in the figure. The uppermost first metal stripe 102 only has first metal jogs 1022 located on the lower side of the first metal stripe 102. There is no second metal jog 1042 disposed on the lower side of the second metal stripe 104 in the lowermost side in the figure. The lowermost second metal stripe 104 only has second metal jogs 1042 located on the upper side of the second metal stripe 104. Because there is no other electrode of the capacitor structure located outside the uppermost first metal stripe 102 and the lowermost second metal stripe 104, no first metal jogs 1022 and the second metal jogs 1042 at the outside are needed to increase the surface area of the electrode. Under this design, the outside of the uppermost first metal stripe 102 and the outside of the lowermost second metal stripe 104 are all planar stripe surfaces. On the other hand, as shown in FIG. 10, the third metal jogs 2021 are still remained on the upper side of the third metal stripes 202 in the uppermost side of the figure for electrically connecting to the first metal jogs 1022 of the first metal layer 100 by the connection elements 302 when it is stacked on one side of the first metal layer 100. However, there is no third metal jog 2022 disposed on the lower side of the third metal stripe 202 in the lowermost side, and the outside of the third metal stripe 202 is a planar stripe surface.

According to the above-mentioned descriptions, the area (or surface area of electrodes) of the faced portions between the first electrode and the second electrode in the MOM capacitor structure can be increased by depositing metal jogs between metal stripes, the metal jogs are misaligned and alternately arranged between different electrodes, thereby increasing the area per unit space of the electrodes and the storage capacity of the capacitor. The present invention provides more than two kinds of arrangement of metal jogs, wherein the metal jogs positioned on two sides of the metal stripe respectively may be mirror-symmetric or anti-symmetric. Arrangement of the metal jogs in the MOM capacitor structure may be designed according to the needs of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-metal (MOM) capacitor, comprising:
    a first metal layer, comprising:
        a plurality of first metal stripes and a plurality of second metal stripes extending along a first direction, the first metal stripes and the second metal stripes being arranged side by side alternately along a second direction, wherein the first direction intersects the second direction;
        a plurality of first metal jogs extending along the second direction, each of the first metal jogs connecting to one of the first metal stripes; and
        a plurality of second metal jogs extending along the second direction, each of the second metal jogs connecting to one of the second metal stripes; and
    a second metal layer disposed on the first metal layer, the second metal layer comprising:
        a plurality of third metal stripes and a plurality of fourth metal stripes extending along the first direction, the third metal stripes and the fourth metal stripes being arranged side by side alternately along the second direction;
        a plurality of third metal jogs extending along the second direction, each of the third metal jogs connecting to one of the third metal stripes; and
        a plurality of fourth metal jogs extending along the second direction, each of the fourth metal jogs connecting to one of the fourth metal stripes respectively;
    wherein on a projection plane, a projection of each of the third metal stripes corresponds to a projection of one of the second metal stripes, a projection of each of the fourth metal stripes corresponds to a projection of one of the first metal stripes, the first metal stripes are electrically connected to the third metal stripes but not electrically connected to the second metal stripes, and the second metal stripes are electrically connected to the fourth metal stripes.

2. The metal-oxide-metal capacitor of claim 1, further comprising:
    a plurality of first connection element disposed respectively between one of the first metal jogs and one of the third metal jogs, each of the first connection element being used for electrically connecting the first metal jog and the third metal jog which are respectively located at an upper end and a lower end of the first connection element; and
    a plurality of second connection element disposed respectively between one of the second metal jogs and one of the fourth metal jogs, each of the second connection elements being used for electrically connecting the second metal jog and the fourth metal jog which are respectively located at an upper end and a lower end of the second connection element.

3. The metal-oxide-metal capacitor of claim 2, wherein each of the first connection elements and each of the second connection elements is a metal plug.

4. The metal-oxide-metal capacitor of claim 1, wherein more than one of the first metal jogs and more than one of the second metal jogs are disposed between one of the first metal stripes and an adjacent second metal stripe of the second metal stripes, and the more than one of the first metal jogs and the more than one of the second metal jogs are arranged side by side alternately along the first direction.

5. The metal-oxide-metal capacitor of claim 1, wherein one of the first metal stripes is connected to more than one of the first metal jogs, and the more than one of the first metal jogs are disposed on both sides of the first metal stripe and are mirror-symmetric by regarding the first metal stripe as a symmetry line.

6. The metal-oxide-metal capacitor of claim 5, wherein an extending line of any one of the first metal jogs along the second direction and an extending line of any one of the second metal jogs along the second direction are misaligned with each other.

7. The metal-oxide-metal capacitor of claim 1, wherein one of the first metal stripes is connected to more than one of the first metal jogs, the more than one of the first metal jogs are disposed on both sides of the first metal stripe, and extending lines of the more than one of the first metal jogs along the second direction are misaligned with each other.

8. The metal-oxide-metal capacitor of claim 7, wherein the extending lines of each of the more than one of the first metal jogs along the second direction overlaps at least one of the second metal jogs.

9. The metal-oxide-metal capacitor of claim 1, wherein the first metal layer further comprises:
    a first bus line extending along the second direction and connected to the first metal stripes; and
    a second bus line extending along the second direction and connected to the second metal stripes;
    wherein the first metal stripes and the second metal stripes are located between the first bus line and the second bus line.

10. The metal-oxide-metal capacitor of claim 9, wherein the second metal layer further comprises:
    a third bus line extending along the second direction and connected to the third metal stripes; and
    a fourth bus line extending along the second direction and connected to the fourth metal stripes;
    wherein the third metal stripes and the fourth metal stripes are located between the third bus line and the fourth bus line.

11. The metal-oxide-metal capacitor of claim 10, wherein on a projection plane, at least a portion of a projection of the first bus line overlaps a portion of a projection of the fourth bus line, and at least a portion of a projection of the second bus line overlaps a portion of a projection of the third bus line.

12. The metal-oxide-metal capacitor of claim 10, wherein on a projection plane, at least a portion of a projection of the first bus line overlaps a portion of a projection of the third bus line, and at least a portion of a projection of the second bus line overlaps a portion of a projection of the fourth bus line.

* * * * *